(12) United States Patent
Berg

(10) Patent No.: US 7,057,422 B2
(45) Date of Patent: Jun. 6, 2006

(54) COMPARATOR

(75) Inventor: Bengt Berg, Solna (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/968,671

(22) Filed: Oct. 19, 2004

(65) Prior Publication Data

US 2005/0093724 A1    May 5, 2005

(30) Foreign Application Priority Data

Oct. 30, 2003   (SE)   .................................. 0302861

(51) Int. Cl.
*H03K 5/22*   (2006.01)
(52) U.S. Cl. .......................................... 327/77; 327/89
(58) Field of Classification Search .................. 327/77, 327/87, 89
See application file for complete search history.

(56) References Cited

U.S. PATENT DOCUMENTS 4,059,804 A    11/1977 Agnus et al.   ................. 327/42
5,761,255 A *   6/1998 Shi   ............................ 375/360

FOREIGN PATENT DOCUMENTS

JP    51999075 A    8/1993
JP    09247220 A    9/1997

* cited by examiner

*Primary Examiner*—Kenneth B. Wells
(74) *Attorney, Agent, or Firm*—Baker Botts L.L.P.

(57) ABSTRACT

An arrangement and a method in an integrated circuit for tuning and setting a value comprising a comparator circuit having a reference voltage input and a variable voltage input is provided to produce a digital value on an output depending on a comparison between the reference voltage and the variable voltage. A first clocked counter circuit is connected to the comparator to increase or decrease the value of the first clocked counter depending on the digital value supplied from the comparator. The arrangement further comprises a second clocked counter circuit connected to the comparator to increase the value of the second clocked counter for each change of value of the comparator, and a locking circuit connected to the second clocked counter circuit to lock the value stored in the first clocked counter circuit from further changes when the second clocked counter reaches a first threshold value.

18 Claims, 1 Drawing Sheet

COMPARATOR

PRIORITY

This application claims priority to Swedish application no. 0302861-0 filed Oct. 30, 2003.

TECHNICAL FIELD OF THE INVENTION

The present invention relates to an arrangement for setting or tuning a value in an integrated circuit and a method therefore. More specifically the present invention relates to an arrangement for securely setting or tuning a value in an integrated circuit wherein said value is set by increasing said value and detecting when a voltage depending on said value passes a threshold and a method therefore.

BACKGROUND OF THE INVENTION

In applications, which are situated on remote places, tuning of circuits could be both expensive and difficult. This can of course also be true for applications located at installations which for other reasons are difficult to reach, such as high up in mast tops or buried in the ground. Nevertheless, setting and tuning of working variables in such circuits could be of vital importance for correct operation, to prevent damaging expensive equipment and saving costs, such as supply power.

One example of such an application could be to set, or tune, the operation point in a power amplifier transistor in a transmitter for a telecommunication application.

In this application the circuit should, by itself, after power up, tune in and hold the correct operation point for the power amplifier transistors in the transmitter. As always, high demands regarding for instance reliability is put on telecommunication application and since the tuning and setting of the operating point for the power transistor is vital for the correct operation of the transistor it is highly important that a secure and reliable tuning and setting is performed.

In prior art applications this could be performed by placing a comparator having two inputs, a first for a reference voltage and a second for a variable voltage, which will vary with the value to be set, in a closed loop comprising a memory. Increasing the value to be set increases the variable voltage until the variable voltage is greater than the reference voltage at which time the comparator changes value. When the comparator changes value the value of the counter is stored in a memory and is used as the value for, for instance the operating point for a power amplifier transistor.

This arrangement has the drawback that if a relatively fast scheme is applied, the counter will count past the optimal value before the comparator changes value. This could partly be due to delays introduced in the system since the value to be set, or tuned, is used in the system to be controlled, which in turn supplies the variable voltage to the comparator. If a slower scheme is applied, tuning will naturally take longer time, which is a major drawback, and nevertheless the delays in the system to be controlled will still affect the results and is oftentimes uncertain.

Even more important is the fact that transients may cause the comparator to change value. Transients may be large compared to the measured value and may cause the comparator to indicate that the variable voltage has passed the reference voltage and thus that the optimal value has been reached, long before the system has tuned in. Noise may also contribute to erroneous changes of the comparator and thus false indications of optimal settings.

Other prior art systems could for instance apply complex, expensive and large microprocessors to achieve a perfect tuning. This solution has the obvious drawbacks of being complex, expensive and taking up large space.

SUMMARY OF THE INVENTION

It is a main object of the present invention to provide such apparatus and method that at least alleviates the above problems.

It is in this respect a particular object of the invention to provide such apparatus and method that achieves a reliable tuning and setting of a value in a integrated circuit, having low complexity and which is easy to implement.

It is still a further object of the invention to provide such apparatus and method that reduces the risk for faults due to racing and hazards in the logic.

It is still a further object of the invention to provide such an apparatus and method that are robust against transients and noise.

These objects among others are, according to a first aspect of the present invention, attained by an arrangement in an integrated circuit for tuning and setting a value comprising a comparator circuit having a reference voltage input and a variable voltage input and being provided to produce a digital value on an output depending on a comparison between the reference voltage and the variable voltage, and a first clocked counter circuit connected to the comparator and provided to increase or decrease the value of the first clocked counter depending on the digital value supplied from the comparator. The arrangement further comprises a second clocked counter circuit connected to said comparator and being provided to increase the value of said second clocked counter for each change of value of said comparator, and a locking circuit connected to said second clocked counter circuit and provided to lock the value stored in said first clocked counter circuit from further changes when said second clocked counter reaches a first threshold value.

The above objects among others are, according to a second aspect of the present invention, attained by a method for setting a value in an integrated circuit comprising a comparator having a first input for receiving a reference voltage, a second input for receiving a variable voltage, and a digital output. The method comprises the steps of comparing the variable voltage with the reference voltage to produce a digital value on the output of the comparator, which value is dependent on which of the variable voltage and reference voltage is greater, increasing a first counter if said digital value is a first value, decreasing said first counter if said digital value is a second value, increasing a second counter when said digital value changes from said first value to said second value or from said second value to said first value, and locking said first counter when said second counter is equal to, or greater than, a threshold value.

By the arrangement and the method above the value of the first counter, which should be used by the system to be controlled, is allowed to pass its optimal value a number of times before it is finally locked to its working value. That is, the value that should be used by the system during operation and which should be equal to, or at least as close as possible to, an optimal value, is allowed to close into its optimum, by swinging back and fourth, before it is locked. Thereby, a more reliable and more optimal value is achieved using a faster scheme. Further, the arrangement and method will not provide an erroneous value even in the presence of transients or noise.

According to a preferred embodiment the first clocked counter is connected to a system to be controlled by the first clocked counter value, and the system to be controlled supplies a variable voltage to said variable voltage input on said comparator.

In more detail the first clocked counter is, according to a preferred embodiment, connected to a system, such as a transmitter comprising a power amplifier transistor. The first clocked counter supplies a value to the system indicating an operating point for the power transistor. The system uses the received value as the operating point for the power transistor and measures the efficiency or performance of the power transistor, and converts this measure to a voltage level. This voltage level is thus an indication of how well the power transistor operates at the given operating point. This voltage level is supplied to the comparator as the variable voltage and is compared to the reference voltage. The comparator thus takes a value indicating if the value for the first clocked counter should be increased or decreased to achieve a better operating point, that is, an operating point that achieves a better performance for the power transistor. When the comparator has changed sign a number of times, which is counted by the second clocked counter, the value of the first clocked counter is locked and this is the value used by the system as the operating point for the power transistor during operation.

Alternatively, the system may supply a value to a DC-converter, which converts the value to a DC voltage. The DC-voltage is then compared with the reference voltage.

Thereby, the arrangement and the method may be used to for instance, tune and set an operating point for a power amplifier transistor.

According to another preferred embodiment the comparator is connected to the first and second clocked counter via a clocked sample-and-hold circuit, to reduce the risk of hazardous behaviour by the logic, for instance, so called "racing".

According to another preferred embodiment the comparator is connected to the first clocked counter via a first sample-and-hold circuit, and the comparator is connected to the second clocked counter via a second sample-and-hold circuit, to further reduce the risk of hazardous behaviour by the logic, for instance, so called "racing."

According to another preferred embodiment a clock generates a first clock pulse to the clocked sample-and-hold circuits, and a second and third clock pulse to the clocked counters, and the first, second and third clock pulses are generated sequentially and separated in time. Thereby, a more reliable circuit is achieved which further reduces the risk of hazardous behaviour by the logic circuits.

According to another preferred embodiment a clock generates a first and third clock pulse to the clocked sample-and-hold circuits, and a second and third clock pulse to the clocked counters, and the first, second and third clock pulses are generated sequentially and separated in time.

According to another preferred embodiment the digital value is a binary digital value.

According to another preferred embodiment the first and second counters are clocked and said first counter is increased or decreased, respectively, for each clocking.

Further characteristics of the invention and advantages thereof will be evident from the following detailed description of embodiments of the invention.

BRIEF DESCRIPTION OF THE DRAWINGS

The present invention will become more fully understood from the detailed description of embodiments of the present invention given herein below and the accompanying FIGS. 1 to 3, which are given by way of illustration only, and thus are not limitative of the present invention.

PREFERRED EMBODIMENTS

In the following description, for purposes of explanation and not limitation, specific details are set forth, such as particular techniques and applications in order to provide a thorough understanding of the present invention. However, it will be apparent to one skilled in the art that the present invention may be practiced in other embodiments that depart from these specific details. In other instances, detailed descriptions of well-known methods and apparatuses are omitted so as not to obscure the description of the present invention with unnecessary details.

Figure 1:
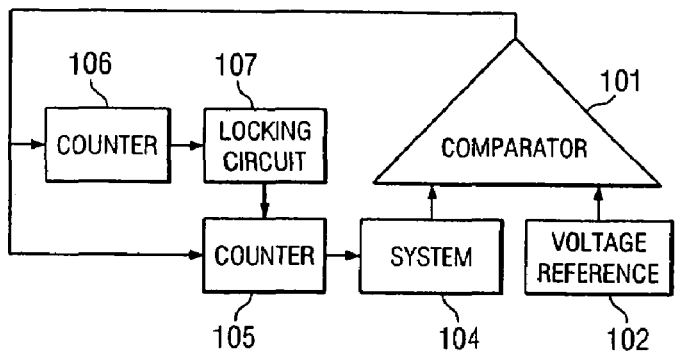
FIG. 1 is a schematic block diagram of a preferred embodiment according to the invention illustrating the main conceptual parts.

FIG. 1 is a schematic block diagram according to a preferred embodiment of the invention comprising a comparator 101 connected to a reference voltage 102 on a first input and a system 104, comprising a power amplifier transistor, on a second input. The system 104 supplies a voltage level to the comparator 101, which is compared with the reference voltage 102. The output from the comparator 101 is a binary digital number, or a logic level.

The binary number takes a first value, for instance a logical one, when the voltage from the system 104 is less than the reference voltage 102, and takes a second value, for instance a logical zero, when voltage from the system 104 is greater than the reference voltage 102.

The output from the comparator 101 is connected to a first counter 105, which is provided to increase its value for every clock cycle that the comparator takes the logical value 1 and decrease its value for every clock cycle that the comparator takes the logical value 0. The counter is further connected to the system 104. The system 104 uses the first counter value 105 for setting an operating point for a power amplifier transistor (not shown). This may be achieved using a digital-to-analogue converter converting the first counter value to a voltage level. The performance of the power amplifier transistor is measured and converted to a voltage indicating the performance of the so selected operating point for the power amplifier transistor. The optimal operating point in the system 104 for the power amplifier transistor will produce a value, which is equal to the reference voltage 102.

The output from the comparator 101 is further connected to a second counter 106. The second counter 106 is provided to increase its value every time the comparator 101 changes value. That is, the value of the second counter 106 is increased every time the value on the comparators output changes from a logical one to a logical zero or vice versa. Thus, the second counter 106 registers every time the value of the first counter 105 passes the optimal value.

The second counter 106 is further connected to a locking circuit 107. When the second counter reaches a predetermined threshold, for instance six, the locking circuit 107, which is connected to the first counter 105, locks the first counter 105 from further changes and the value of the first counter 105 can now be used by the system 104 for optimally setting the operating point for the power amplifier transistor.

By allowing the tuning of the value of the first counter 105 to pass the optimal setting a number of times before locking the first counter 105, the value is allowed to swing back and fourth closer to the optimum. Thereby, a faster clock frequency for clocking the circuits can be used and a generally quicker tuning and setting of the optimum value can be achieved.

If a transient would occur on the input to the comparator when the value of the first clocked counter is not closed to its optimal value, which would bring the value of the variable voltage above the reference voltage, the comparator would change value. In an arrangement according to the prior art this would trigger the locking mechanism and a false optimal operating point would be set. In the inventive arrangement, however, this would only increase the value of the second clocked counter and the tuning of the operating point for the power amplifier transistor would be allowed to continue.

Figure 2:
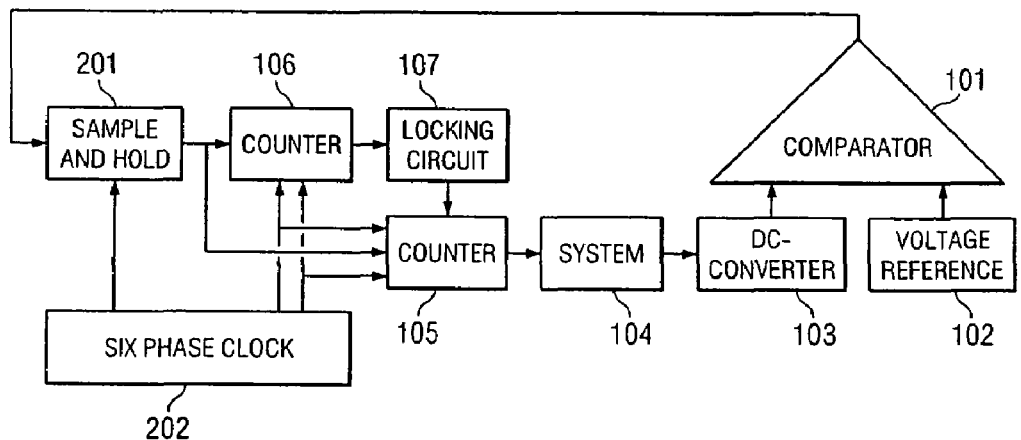
FIG. 2 is a schematic block diagram of a preferred embodiment according to the invention including a sample-and-hold block.

To prevent "hazard" behaviour of the logic, such as "racing", the embodiment described in connection with FIG. 1 may be fitted with a "sample-and-hold" circuit 201 and a six-phase clock 202 as disclosed in FIG. 2. The sample-and-hold circuit 201 is provided to sample a value from the comparator 101 and store the value in a temporary storage. Upon a clock signal, supplied by the six-phase clock 202, the value will be presented to the first and second counter 105 and 106, respectively. In FIG. 2, a DC-converter 103 is also disclosed for converting a value, indicating the performance of the system 104 with the value supplied by the first clocked counter 105, to a DC value, according to a preferred embodiment of the invention.

The six-phase clock 202 is provided to supply three clock pulses, which are separated in time. That is, the six-phase clock 202 supplies a first clock pulse to the sample-and-hold circuit 201, waits a specified time, supplies a second clock pulse to the first and second counter 105 and 106, respectively, waits the specified time, supplies a third clock pulse to the first and second counter 105 and 106 and finally waits the specified time before starting over again. Thus, three clock pulses are generated and between each clock pulse a specified time is allowed to lapse before the next clock pulse.

Figure 3:
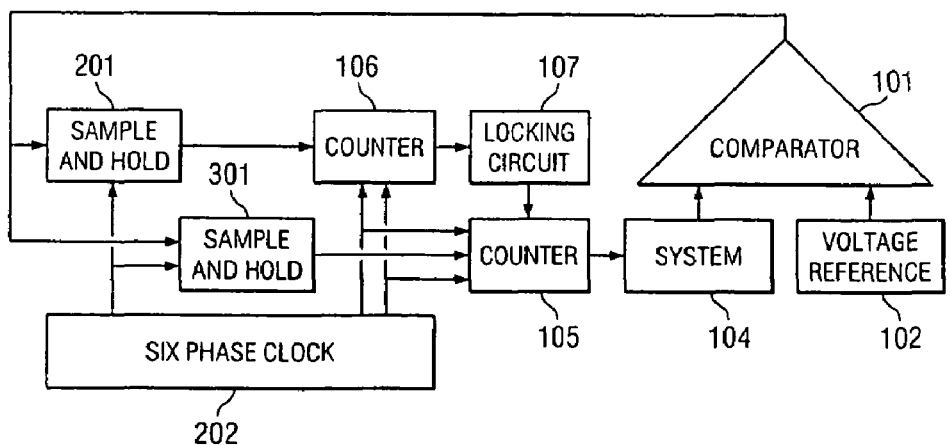
FIG. 3 is a schematic block diagram of a preferred embodiment according to the invention including two sample-and-hold blocks.

In a further embodiment, disclosed in FIG. 3, according to the invention a first and a second "sample-and-hold" circuit 301 and 302, respectively are provided to sample and hold the value from the comparator 101 and to present the value to the first and second counter 105 and 106, respectively.

It will be obvious that the invention may be varied in a plurality of ways. For instance it should be noted that the reference voltage might change value between different tunings. Such variations are not to be regarded as a departure from the scope of the invention. All such modifications as would be obvious to one skilled in the art are intended to be included within the scope of the appended claims.

I claim:

1. An arrangement in an integrated circuit for setting a value comprising
    a comparator circuit having a reference voltage input and a variable voltage input and being provided to produce a digital value on an output depending on a comparison between said reference voltage and said variable voltage,
    a first clocked counter circuit connected to said comparator circuit and provided to increase or decrease the value of said first clocked counter circuit depending on the digital value supplied from said comparator circuit,
    a second clocked counter circuit connected to said comparator and being provided to increase the value of said second clocked counter circuit for each change of value of said comparator digital value, and
    a locking circuit connected to said second clocked counter circuit and provided to lock the value stored in said first clocked counter circuit from further changes when said second clocked counter circuit reaches a first threshold value.

2. The arrangement in claim 1, wherein
    said first clocked counter circuit comprises an output,
    said first clocked counter circuit output is connected to a system to be controlled by said first clocked counter circuit value, and
    said system to be controlled supplies a variable voltage to said variable voltage input on said comparator.

3. The arrangement according to claim 1, wherein
    said comparator circuits is connected to said first and second clocked counter circuit via a clocked sample-and-hold circuit.

4. The arrangement according to claim 1, wherein
    said comparator is connected to said first clocked counter via a first sample-and-hold circuit, and
    said comparator is connected to said second clocked counter via a second sample-and-hold circuit.

5. The arrangement according to claim 3, wherein
    a clock generates a first clock pulse to said clocked sample-and-hold circuits, and a second and third clock pulse to said clocked counters, and
    said first, second and third clock pulses are generated sequentially and separated in time.

6. The arrangement according to claim 4, wherein
    a clock generates a first clock pulse to said clocked sample-and-hold circuits, and a second and third clock pulse to said clocked counters, and
    said first, second and third clock pulses are generated sequentially and separated in time.

7. The arrangement according to claim 3, wherein
    a clock generates a first and third clock pulse to said clocked sample-and-hold circuits, and a second and third clock pulse to said clocked counters, and
    said first, second and third clock pulses are generated sequentially and separated in time.

8. The arrangement according to claim 4, wherein
    a clock generates a first and third clock pulse to said clocked sample-and-hold circuits, and a second and third clock pulse to said clocked counters, and
    said first, second and third clock pulses are generated sequentially and separated in time.

9. A method for setting a value in an integrated circuit comprising a comparator having a first input for receiving a reference voltage, a second input for receiving a variable voltage, and a digital output, said method comprising the steps of:
    comparing said variable voltage with said reference voltage to produce a digital value on said output, which value is dependent on which of said variable voltage and reference voltage is greater,
    increasing a first counter if said digital value is a first value,
    decreasing said first counter if said digital value is a second value, increasing a second counter when said digital value changes from said first value to said second value or from said second value to said first value, and locking said first counter when said second counter is equal to, or greater than, a threshold value.

10. The method according to claim 9, wherein
said digital value is a binary digital value.

11. The method according to claim 9, wherein
said first and second counters are clocked and said first counter is increased or decreased, respectively, for each clocking.

12. An arrangement in an integrated circuit for setting a value comprising a comparator circuit having a reference voltage input and a variable voltage input and being provided to produce a digital value on an output depending on a comparison between said reference voltage and said variable voltage, a first clocked counter connected to said comparator and provided to increase or decrease the value of said counter depending on the digital value supplied from said comparator, wherein the first clocked counter comprises an output connected to a system to be controlled by said first clocked counter value, wherein said system generates a variable voltage for said variable voltage input on said comparator, a second clocked counter circuit connected to said comparator and being provided to increase the value of said second clocked counter for each change of value of said comparator, and a locking circuit connected to said second clocked counter circuit and provided to lock the value stored in said first clocked counter circuit from further changes when said second clocked counter reaches a first threshold value.

13. The arrangement according to claim 12, wherein
said comparator is connected to said first and second clocked counter via a clocked sample-and-hold circuit.

14. The arrangement according to claim 12, wherein
said comparator is connected to said first clocked counter via a first sample-and-hold circuit, and said comparator is connected to said second clocked counter via a second sample-and-hold circuit.

15. The arrangement according to claim 14, wherein
a clock generates a first clock pulse to said clocked sample-and-hold circuits, and a second and third clock pulse to said clocked counters, and said first, second and third clock pulses are generated sequentially and separated in time.

16. The arrangement according to claim 15, wherein
a clock generates a first clock pulse to said clocked sample-and-hold circuits, and a second and third clock pulse to said clocked counters, and said first, second and third clock pulses are generated sequentially and separated in time.

17. The arrangement according to claim 14, wherein
a clock generates a first and third clock pulse to said clocked sample-and-hold circuits, and a second and third clock pulse to said clocked counters, and said first, second and third clock pulses are generated sequentially and separated in time.

18. The arrangement according to claim 15, wherein
a clock generates a first and third clock pulse to said clocked sample-and-hold circuits, and a second and third clock pulse to said clocked counters, and said first, second and third clock pulses are generated sequentially and separated in time.

* * * * *